United States Patent [19]

McNeel et al.

[11] Patent Number: 4,532,450
[45] Date of Patent: Jul. 30, 1985

[54] COMPOUND PIEZOELECTRIC ACCELEROMETER WITH RESIDUAL VOLTAGE MATCHING

[75] Inventors: William O. McNeel; James A. Sackett, both of Houston, Tex.

[73] Assignee: Litton Resources Systems, Inc., Alvin, Tex.

[21] Appl. No.: 640,300

[22] Filed: Aug. 13, 1984

Related U.S. Application Data

[62] Division of Ser. No. 562,920, Dec. 19, 1983, Pat. No. 4,505,014.

[51] Int. Cl.³ .............................................. H01L 41/08
[52] U.S. Cl. .................................... 310/329; 310/331; 310/332; 73/516 LM
[58] Field of Search ............... 310/329, 331, 332, 338, 310/346, 312, 315; 367/166, 155, 171, 159; 73/516 LM, 516 R

[56] References Cited

U.S. PATENT DOCUMENTS

| | | | |
|---|---|---|---|
| 3,813,744 | 6/1974 | Morris | 310/329 X |
| 3,970,878 | 7/1976 | Berglund | 310/331 X |
| 4,317,059 | 2/1982 | Besson | 310/346 X |
| 4,334,296 | 6/1982 | Hall, Jr. | 367/166 X |
| 4,344,010 | 8/1982 | Vig | 310/346 X |
| 4,345,473 | 8/1982 | Berni | 310/329 X |
| 4,395,908 | 8/1983 | Shopland | 73/517 LM |
| 4,455,500 | 6/1984 | Savit et al. | 310/329 X |

*Primary Examiner*—Mark O. Budd
*Attorney, Agent, or Firm*—William A. Knox

[57] ABSTRACT

The compound accelerometer is made by combining two simple accelerometer units. The simple accelerometer units consist of a hollow container closed at each end by a piezo-electric transducer. The two transducers are oppositely polarized and are selected to have a desired combined series capacitance value. The container is partially filled with a volume of heavy liquid and the accelerometer is excited. During excitation, the output voltage is continuously measured and the volume of liquid is microadjusted until the output voltage equals a prescribed level. The outputs of the individual transducers are measured, the residual voltage difference is tabulated and the dominant transducer is identified. Two simple accelerometer units having the same residual voltage difference are secured together with the dominant transducers facing oppositely with respect to each other.

3 Claims, 3 Drawing Figures

COMPOUND PIEZOELECTRIC ACCELEROMETER WITH RESIDUAL VOLTAGE MATCHING

This is a division of application Ser. No. 562,920, filed 12/19/83, now U.S. Pat. No. 4,505,014 issued Mar. 19, 1985.

BACKGROUND OF THE INVENTION

1. Field of the Invention

This invention relates to accelerometers having a liquid inertia mass.

2. Description of the Prior Art

Accelerometers used in seismic exploration may take the form of a cylindrical chamber, closed at each end by a piezo-electric wafer. A quantity of mercury fills most of the volume of the closed chamber and serves as a liquid inertia mass. In most orientations of the principal axis of such an accelerometer unit, the accelerometer output signal is affected by both vertical and horizontal accelerating forces. One or the other of the acceleration vectors can be isolated by additively or subtractively combining the respective electrical outputs of the two piezo-electric wafers. One such accelerometer is disclosed in U.S. Pat. No. 4,334,296, issued June 8, 1982 to E. M. Hall, Jr., which is incorporated herein by reference.

The degree of cancellation of an unwanted acceleration vector depends of course, on the precision with which the two wafers can be matched as to their electrical and mechanical parameters. It has been our experience that it is impractical from a commercial production standpoint to hand-pick unmounted wafers that match exactly. We have also found that wafers which match precisely before assembly, commonly become mismatched during the assembly process.

One method for matching the sensitivities of the two piezo-electric wafers after assembly is disclosed in U.S. Pat. No. 4,395,908 issued Aug. 8, 1983 to R. C. Shopland. Another method is disclosed in a co-pending U.S. patent application Ser. No. 517,899, now U.S. Pat. No. 4,455,500 in the name of C. H. Savit et al. Although those methods served their intended purpose of matching the mechanical and electrical parameters of the wafers of an assembled accelerometer, the methods tend to complicate the commercial manufacturing operation.

SUMMARY OF THE INVENTION

It is a purpose of this invention to provide a compound accelerometer that will be maximally sensitive to a desired acceleration vector to the virtually complete exclusion of any residual signal due to an unwanted orthogonal acceleration vector, and one that will be practical for commercial production.

In accordance with a preferred embodiment of our invention, we select several sets of two oppositely-polarized piezo-electric transducers from among a larger number of such transducers. Each set of transducers is characterized by a predetermined combined capacitance value and a matched set of output voltage sensitivities per unit force input equal to at least a threshold value. The two transducers of a set are mounted, in spaced-apart relationship, in a container. The container is partially filled with a prescribed volume of a heavy liquid thereby to provide a simple accelerometer unit. The accelerometer unit is excited by a desired accelerating force at a specified frequency. The total voltage output of the accelerometer unit is continuously measured while under excitation and the volume of liquid is micro-adjusted until the output voltage equals a prescribed value. The output voltage of each individual transducer is then measured to determine a residual voltage and the dominant transducer of the two is identified. A plurality of simple accelerometer units are sorted by pairs such that the two units of a pair are exactly matched as to residual voltage. They may be further matched as to total capacitance. The two simple accelerometer units are secured together with the dominant transducers facing oppositely with respect to each other. The resulting compound accelerometer is insensitive to acceleration in the undesired direction to the extent of the precision with which the matching of the simple accelerometers is achieved.

BRIEF DESCRIPTION OF THE DRAWINGS

A better understanding of the benefits and advantages of our invention may be obtained from the appended detailed description and the drawings, wherein.

DETAILED DESCRIPTION OF THE PREFERRED EMBODIMENT

Figure 1:
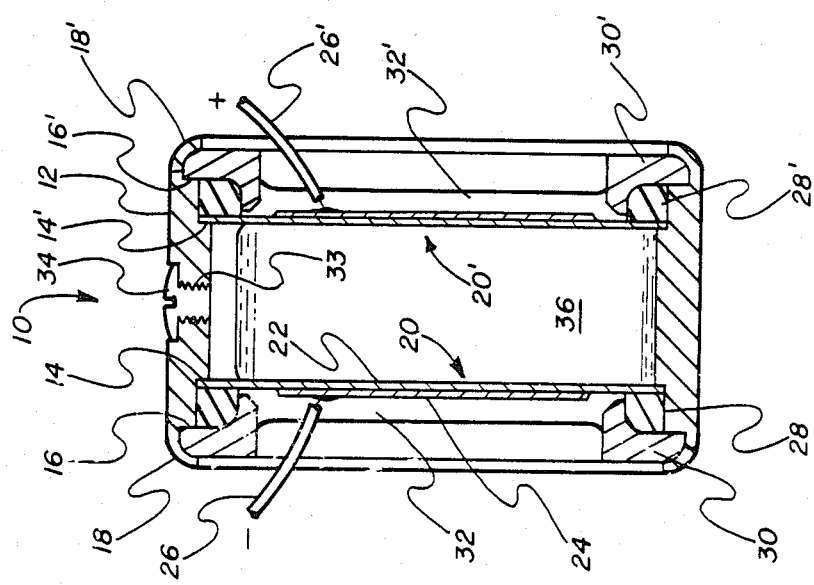
FIG. 1 is a cross section of a simple accelerometer unit having a liquid inertia mass.

Referring now to FIG. 1, there is shown a cross section of a simple accelerometer unit 10 whose principal components will be described briefly. The unit consists of a conductive cylindrical case or chamber 12 having inner and outer shoulders 14, 16 and 14', 16' at each end. Thin outer walls 18, 18' that extend beyond outer shoulders 16, 16' later may be crimped over as shown.

The ends of chamber 12 are closed by transducers 20, 20'. The transducers, of which 20 is typical, are composed of a thin metal diaphragm or substrate 22 to which is cemented a ceramic piezo-electric wafer 24 using a conductive epoxy resin. The left hand exposed face of wafer 24, for example, in FIG. 1 constitutes the free-air face of that transducer.

Before assembly, the piezo-electric wafers are polarized. By seismic industry standards a wafer is said to be positively polarized if, when a compressive force is applied against the free-air face, the free-air face develops a positive charge relative to the substrate. In the assembly of FIG. 1, the two wafers are oppositely polarized.

Simple accelerometer unit 10 is assembled by seating transducers 20, 20' on shoulders 14, 14' respectively, followed by O-rings 28, 28'. Retaining rings 30, 30', preferably brass, are seated on outer shoulders 16, 16' and are held in place by crimping thin walls 18, 18' over the retaining rings. At this point, the assembly operation is not critical except that the retaining rings must not touch the substrate and must be evenly secured in place. The free air faces of the piezo-electric wafers are metal-plated so that leads 26, 26' may be soldered thereto. If desired, the free air faces of the piezo-electric wafers may be coated with a sealant 32 such as but not limited to a polysulfide resin. A fill hole 33 and a cap screw 34 are provided for filling the chamber 12 with a volume of heavy liquid having a specific gravity of at least 9.6 such as mercury, 36, as will be later discussed. An electrical series-connection between the two transducers is established through the conductive case 12.

Figure 2:
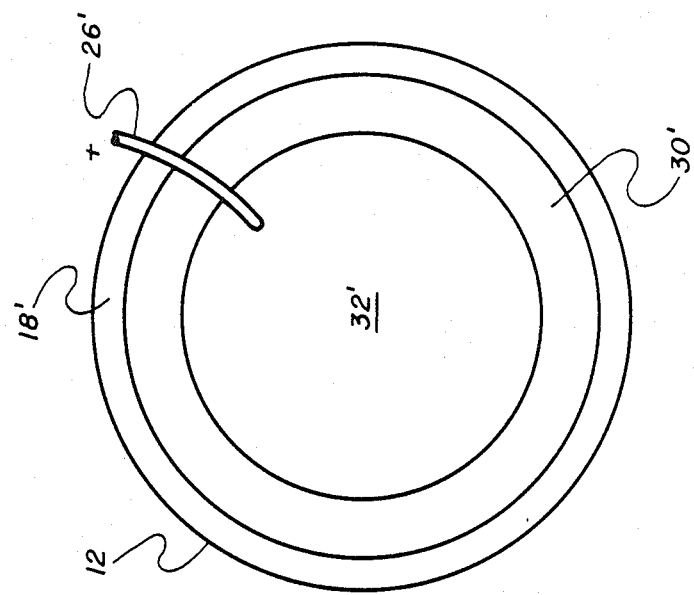
FIG. 2 is an end view of the accelerometer unit of FIG. 1.

FIG. 2 is an end view of the accelerometer unit of FIG. 1 wherein the same reference numbers represent the same parts in the two figures.

In general it is contemplated that in normal use, the accelerometer unit will be operated in the orientation shown in FIG. 1. That is, an axial line parallel to the principal structural axis which passes perpendicularly through the transducers will be approximately orthogonal to the gravitational vertical. The orientation is not critical however.

In the '296 reference patent, the two oppositely-mounted transducer piezo-electric wafers have the same polarity. The two leads of each transducer may be brought out separately so that the transducer output voltages could be combined externally, either additvely or subtractively. In our embodiment, we prefer to minimize the internal wiring by using the conductive case to complete a series circuit between two oppositely-polarized transducers.

In FIG. 1, the spacing between the transducers is shown to be relatively small with respect to their diameter. From well-known physical principles, for a given transducer spacing, the output voltage sensitivity of the transducers is inherently a function of the length of the mercury column between the transducers as measured along a line directed parallel to the desired acceleration vector. The electrical and mechanical design as shown in FIG. 1, by way of example but not by way of limitation, tends to favor a vertical acceleration vector.

So far, we have discussed the general method of construction of an accelerometer unit having a liquid inertia mass contained within a cylindrical chamber that is closed at each end by a transducer element. We shall now disclose in detail, the assembly of a compound accelerometer that is maximally sensitive to a desired acceleration vector and which is capable of substantially cancelling the output signal due to an unwanted acceleration vector.

A quantity each of oppositely-polarized transducers are prepared. The capacitance of each transducer is measured to three significant places. The transducers are then marked and sorted by their capacitance, with an individual bin for each incremental value. Typically, the capacitance, for an exemplary lot of transducers, might range from 12.0 to 16.5 nanofarads (nf). Transducers whose capacitance falls outside that range should be discarded. There are now two groups of sorted transducers: one group being positively polarized and one group being negatively polarized.

In the same operation that the capacitance is measured, each transducer is mounted on a fixture on a shaking table where it is driven at a specified acceleration level at a desired frequency under prescribed loading conditions. That is, a floating solid inertia mass is applied to the center of the transducer by the test fixture. For example the shaking table might drive the transducers at 1 in/sec$^2$ at 70 Hz. The threshold output voltage of the transducers should be, for example, at least 30 millivolts (mv). Transducers having a lesser output should be discarded. The value of the measured output voltage is marked on each transducer with ink or other permanent marking means.

Next, pairs of oppositely-polarized transducers are selected such that the two selected transducers have a combined series capacitance of 7 nf ±5% and threshold output voltages that match within about ±3%. Each pair of transducers is then assembled into a complete simple acceleration unit as previously described. The completed unit is assigned a serial number for identification.

The completed units are then nearly filled with a precisely specified quantity of a heavy liquid, preferably mercury. The nearly-filled accelerometer unit (about 90% full) is placed on the shaking table and is excited at a desired acceleration level at a desired frequency. In an exemplary test, the quantity of mercury was 1.4 cc and the drive level was 10 in/sec$^2$ at 70 Hz. While the accelerometer unit is being driven, the output voltage is continuously measured. Manually, by means of a metering syringe or automatically by a pumping system, the output of the accelerometer unit is micro-adjusted by adding or removing micro-volumes of mercury from the accelerometer unit until the output voltage reaches a specified value ±1 mv. In the exemplary test, the specified value was 20 mv. Thereafter the cap screw is replaced. The accelerometer output is again measured to insure that insertion of the cap screw has not disturbed the calibration.

Finally, the output voltage of each individual transducer, measured relative to the conductive case 12, is measured and tabulated on a listing as a function of the unit serial number. Thus, there will be a positive voltage and a negative voltage for each unit. A residual voltage, let us call it X, is determined by subtracting the absolute value of the negative voltage from the positive voltage. The sign of X determines whether the positively or the negatively polarized transducer is electrically dominant. That is, the dominant transducer is the transducer that is characterized by the greater voltage sensitivity. The signed value of X and the total capacitance of the accelerometer unit are entered on the listing. The listing is computer-sorted first by residual voltage increments and then by increments in capacitance. Pairs of simple accelerometer units, identified by serial number, that are exactly matched as to the numerical value of the residual voltages are selected from the listings. A mismatch in total capacitance is of less importance although it is preferable to pair-off a simple accelerometer unit having a higher total capacitance than average with another unit having a lower-than-average capacitance, provided only that residual voltages X are equal.

Figure 3:
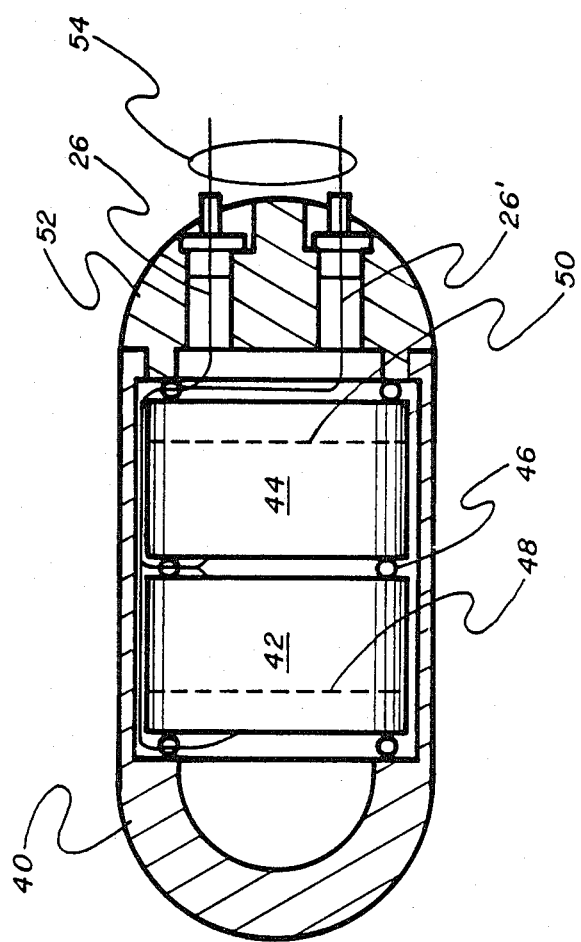
FIG. 3 is a cross-sectional view of the compound accelerometer of this invention.

Referring now to FIG. 3, a plastic case 40 is provided. A pair of matched simple accelerometer units 42, 44 are inserted into the case, separated by an O-ring 46 and are secured together. It is essential that the electrically dominant transducers such as 48, 50 of accelerometers 42 and 44 face in opposite directions. Whether the electrically dominant transducers face each other or face away from each other as shown in unimportant; it is important that they face oppositely. The two accelerometers may be electrically connected in parallel or in series. If the compound accelerometer is to work into a charge-coupled preamplifier, the simple accelerometer units should be connected in parallel to obtain the highest possible amplifier sensitivity. Otherwise, such as for transformer coupling, they may be series-connected. Once secured together in place, the simple accelerometer units are sealed in by an end cap 52 having an exit port for accelerometer leads 54. The design details of case 40 are unimportant and are commensurate with the service to which the compound accelerometer is to be subjected, i.e. dry land or deep marine environments.

For illustrative purposes, our invention has been described with a certain degree of specificity. Variations in the method of manufacture will occur to those skilled in the art but which lie within the scope of the inventive process which is limited only by the appended claims.

We claim as our invention:

1. In a compound accelerometer the improvement comprising:
   a first and second simple accelerometer units, each simple accelerometer unit including
   a. a hollow conductive open-ended case;
   b. piezo-electric transducers sealing each end of said case to form a chamber, said piezo-electric transducers being oppositely polarized, one of said piezo-electric transducers being electrically dominant;
   c. a sufficient volume of a conductive heavy liquid nearly filling said chamber; and
   means for securing together said first and second simple accelerometer units, said first and second simple accelerometer units being matched as to residual voltage with the electrically dominant piezo-electric transducers of the simple accelerometer units facing in opposite directions.

2. The compond accelerometer as defined by claim 1 wherein:
   the volume of said conductive heavy liquid in each simple accelerometer unit is sufficient to render the voltage sensitivity of each said simple accelerometer unit to equal a desired level when said simple accelerometer units are excited under prescribed conditions of acceleration and frequency.

3. The compound accelerometer as defined by claim 2, wherein the piezo-electric transducers of each said simple accelerometer unit are matched as to capacitance within a desired tolerance.

* * * * *